(12) United States Patent
Akella et al.

(10) Patent No.: US 9,643,835 B2
(45) Date of Patent: May 9, 2017

(54) MICROFLUIDIC DEVICES AND APPLICATIONS THEREOF

(71) Applicant: University of North Carolina At Charlotte, Charlotte, NC (US)

(72) Inventors: Srinivas Akella, Charlotte, NC (US); Vasanthsekar Shekar, Bloomington, MN (US)

(73) Assignee: University of North Carolina at Charlotte, Charlotte, NC (US)

( * ) Notice: Subject to any disclaimer, the term of this patent is extended or adjusted under 35 U.S.C. 154(b) by 619 days.

(21) Appl. No.: 14/016,837

(22) Filed: Sep. 3, 2013

(65) Prior Publication Data

US 2014/0102900 A1 Apr. 17, 2014

Related U.S. Application Data

(60) Provisional application No. 61/712,472, filed on Oct. 11, 2012.

(51) Int. Cl.
*B01L 3/00* (2006.01)
*B81B 1/00* (2006.01)

(52) U.S. Cl.
CPC .......... *B81B 1/00* (2013.01); *B01L 3/502792* (2013.01); *B01L 2300/089* (2013.01); *B01L 2300/0816* (2013.01); *B01L 2300/0819* (2013.01); *B01L 2300/165* (2013.01); *B01L 2400/0406* (2013.01); *B01L 2400/0454* (2013.01); *B01L 2400/082* (2013.01)

(58) Field of Classification Search
CPC ......... B01L 3/502784; B01L 240/0427; G01N 2021/8564; G01N 2015/1406; G02B 26/005; G02B 2207/115; B03C 5/00–5/028

See application file for complete search history.

(56) References Cited

U.S. PATENT DOCUMENTS

| | | | |
|---|---|---|---|
| 2009/0170186 A1* | 7/2009 | Wu | B03C 5/026 435/286.1 |
| 2012/0091003 A1* | 4/2012 | Chuang | B03C 5/02 204/547 |

OTHER PUBLICATIONS

Pei, et al. "Light-actuated digital microfluidics for large-scale, parallel manipulation of arbitrarily sized droplets", IEEE 23rd International Conference on Micro Electro Mechanical Systems, Jan. 24-28, 2010, p. 252-255.*

(Continued)

*Primary Examiner* — J. Christopher Ball
(74) *Attorney, Agent, or Firm* — J. Clinton Wimbish; Smith Moore Leatherwood LLP

(57) ABSTRACT

In one aspect, single-sided microfluidic devices are described herein. In some embodiments, a single-sided microfluidic device comprises a substrate, a photoconductive layer positioned over the substrate, electrical contacts in electrical communication with the photoconductive layer, and a dielectric assembly positioned over the photoconductive layer. The dielectric assembly comprises a hydrophobic surface for receiving a liquid. In some embodiments, the dielectric assembly has an effective capacitance of about 10 $\mu F/m^2$ to about 10,000 $\mu F/m^2$ and/or an average thickness between about 20 nm and about 2000 nm.

8 Claims, 7 Drawing Sheets

(56) References Cited

OTHER PUBLICATIONS

Park, et al. "Single-sided continuous optoelectrowetting (SCOEW) for droplet manipulation with light patterns", Lab on a Chip, Jul. 7, 2010, vol. 10, No. 13, p. 1633-1661.*
H. Moon, et al. "Low Voltage Electrowetting-on-Dielectric" Journal of Applied Physics vol. 92, No. 7, Oct. 1, 2002, p. 40804087.*

* cited by examiner

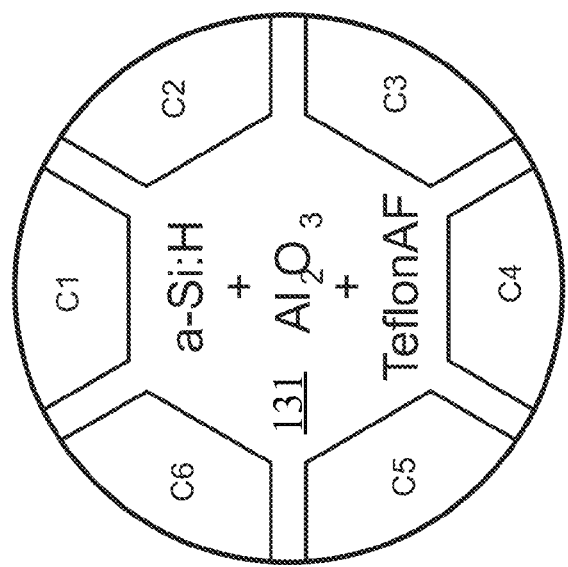
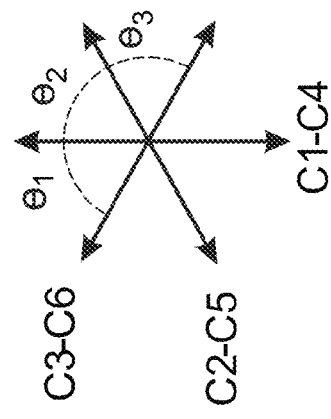
Figure 3
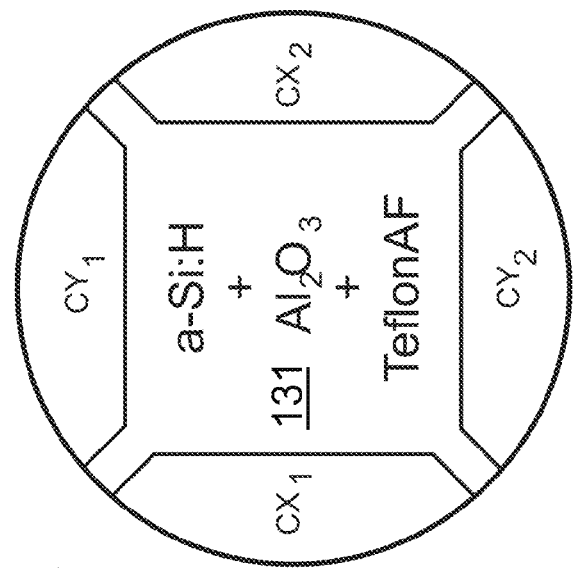
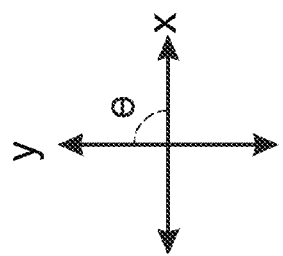
Figure 2

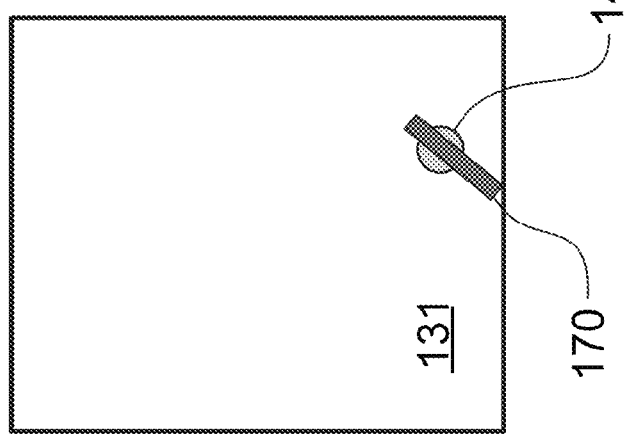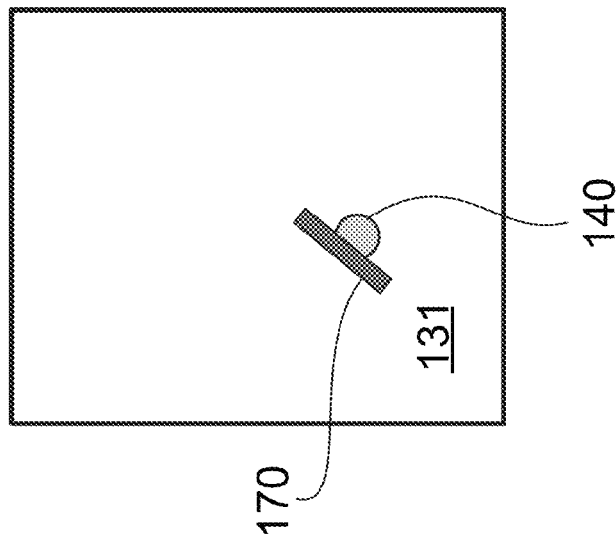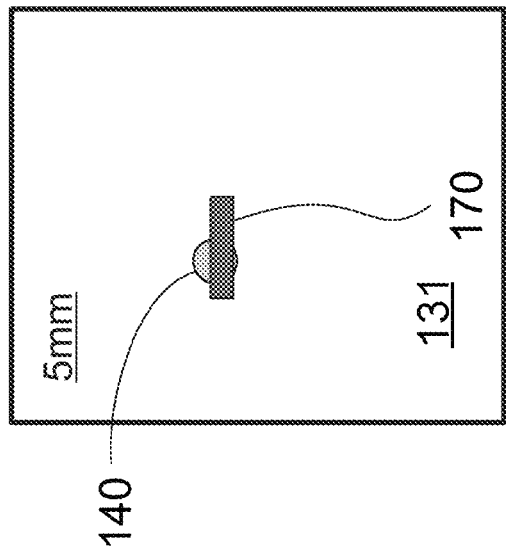

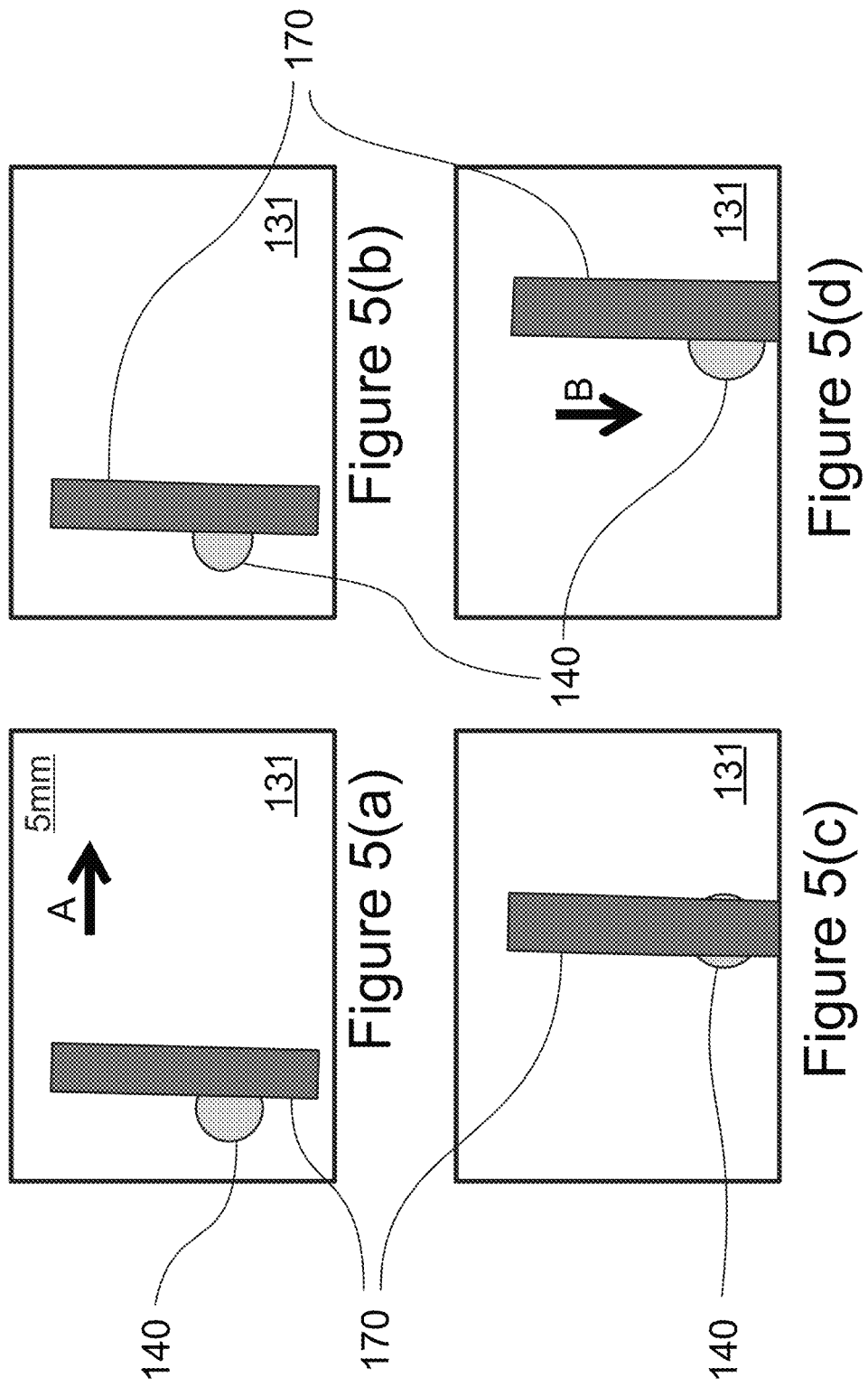

MICROFLUIDIC DEVICES AND APPLICATIONS THEREOF

CROSS REFERENCE TO RELATED APPLICATION

This application claims priority pursuant to 35 U.S.C. §119(e) to U.S. Provisional Patent Application Ser. No. 61/712,472, filed on Oct. 11, 2012, which is hereby incorporated by reference in its entirety.

STATEMENT REGARDING FEDERALLY SPONSORED RESEARCH

This invention was made with government support under contract number IIS-1019160 awarded by the National Science Foundation. The government has certain rights in the invention.

FIELD

This invention relates to microfluidic devices and, in particular, to single-sided microfluidic devices.

BACKGROUND

Digital microfluidics deals with the manipulation of discrete liquid droplets on a surface. Further, digital microfluidics can be contrasted with microchannel microfluidics, in which liquid droplets are disposed and manipulated within a microchannel. Digital microfluidic droplet manipulation technologies can include the use of surface acoustic waves, thermocapillary forces, electrowetting, dielectrophoresis, optical forces, or magnetic forces. However, the effectiveness of some previous digital microfluidic devices has been limited. Some electrowetting devices, for example, fixed electrode configurations, and/or fixed droplet volumes. Some optoelectrowetting devices require high threshold voltages and also the use of high power optical illumination. In addition, some devices suffer from low droplet manipulation speeds and/or the inability to move a droplet in a desired direction on a device surface.

Therefore, there exists a need for improved microfluidic devices that can provide superior performance and/or efficiency.

SUMMARY

In one aspect, single-sided or open digital microfluidic devices are described herein. In some embodiments, a single-sided microfluidic device comprises a substrate, a photoconductive layer positioned over the substrate, electrical contacts in electrical communication with the photoconductive layer, and a dielectric assembly positioned over the photoconductive layer. The dielectric assembly comprises a hydrophobic surface for receiving a liquid. Further, in some embodiments, the dielectric assembly has an effective capacitance of about 10 $\mu F/m^2$ to about 10,000 $\mu F/m^2$ and/or an average thickness between about 20 nm and about 2000 nm. Moreover, a dielectric assembly of a device described herein can be formed from a single hydrophobic layer or can comprise multiple layers. In some embodiments, for instance, at least one layer of a dielectric assembly is formed from a hydrophobic dielectric material and at least one other layer of the dielectric assembly is formed from a dielectric material having a dielectric constant of at least about 3 or at least about 5.

In addition, in some embodiments, a single-sided microfluidic device described herein further comprises a radiation source. The radiation source, in some instances, can be used to project an image onto the photoconductive layer of the device. The image, in some cases, has a shape configured to contain the droplet during movement of the droplet on the hydrophobic surface. Further, in some embodiments, the ratio of the radius of the droplet to a width of the image is between about 0.67 and about 2.0 or between about 0.85 and about 1.5. Moreover, a single-sided microfluidic device described herein, in some instances, has a threshold voltage of less than about 1 kV, including but not limited to when the radiation source provides radiation at an intensity of less than about 4000 lumens or less than about 500 $cd/m^2$.

Moreover, in some embodiments, the electrical contacts of a microfluidic device described herein are arranged in pairs diametrically opposed to one another. Further, in some embodiments, such pairs of electrical contacts are positioned to permit liquid droplet movement in both the lateral (x) and vertical (y) dimensions on the plane of the hydrophobic surface. In some cases, the electrical contacts are positioned to permit liquid droplet movement in any direction on the xy-plane.

In another aspect, methods of moving a droplet of liquid are described herein. In some embodiments, a method of moving a droplet of liquid comprises disposing the droplet on a hydrophobic surface of a dielectric assembly of a single-sided microfluidic device described herein. Thus, in some instances, the dielectric assembly of the device is positioned over a photoconductive layer in electrical communication with electrical contacts. Methods of moving a droplet of liquid described herein also comprise applying a voltage to the electrical contacts; projecting an image onto the photoconductive layer with a radiation source so that the image partially overlaps the droplet; and moving the droplet on the hydrophobic surface by moving the image. The dielectric assembly can have the structure and/or properties of any dielectric assembly described herein. For example, in some embodiments, the dielectric assembly has an effective capacitance of about 10 $\mu F/m^2$ to about 10,000 $\mu F/m^2$ and/or an average thickness between about 20 nm and about 2000 nm.

In addition, in some cases, a method of moving a droplet of liquid described herein comprises applying a voltage of less than about 1 kV to the electrical contacts of a device. Moreover, in some embodiments, a voltage of less than about 1 kV is applied when the photoconductive layer is illuminated by the radiation source at an intensity of less than about 4000 lumens or less than about 500 $cd/m^2$.

In yet another aspect, methods of reducing the drift of a droplet of liquid are described herein. In some embodiments, a method of reducing the drift of a droplet of liquid comprises disposing the droplet on a hydrophobic surface of a dielectric assembly of a single-sided microfluidic device described herein. In some instances, for example, the dielectric assembly of the device is positioned over a photoconductive layer in electrical communication with electrical contacts. Methods of reducing the drift of a droplet of liquid described herein further comprise applying a voltage to the electrical contacts of the device; projecting an image onto the photoconductive layer with a radiation source so that the image partially overlaps the droplet; and moving the droplet on the hydrophobic surface by moving the image, wherein the image has a shape configured to contain the droplet during movement of the droplet on the hydrophobic surface. In some embodiments, the image comprises a polygon or a curved shape such as a crescent, circle, or ellipse. In some embodiments, the image comprises a union or intersection of a polygon and a curved shape. In some cases, the image comprises a hollow or "frame" shape, such as a rectangular, elliptical, or circular "picture frame" or "donut" type shape. In some embodiments, the image has a U-shape, H-shape or V-shape.

These and other embodiments are described in greater detail in the detailed description which follows.

BRIEF DESCRIPTION OF THE DRAWINGS

FIG. 2 illustrates a plan view of a single-sided microfluidic device according to one embodiment described herein.

FIG. 3 illustrates a plan view of a single-sided microfluidic device according to one embodiment described herein.

FIGS. 4(a)-(c) illustrate a method of moving a droplet of liquid according to one embodiment described herein.

FIGS. 5(a)-(d) illustrate a method of moving a droplet of liquid according to one embodiment described herein.

DETAILED DESCRIPTION

Figure 1:
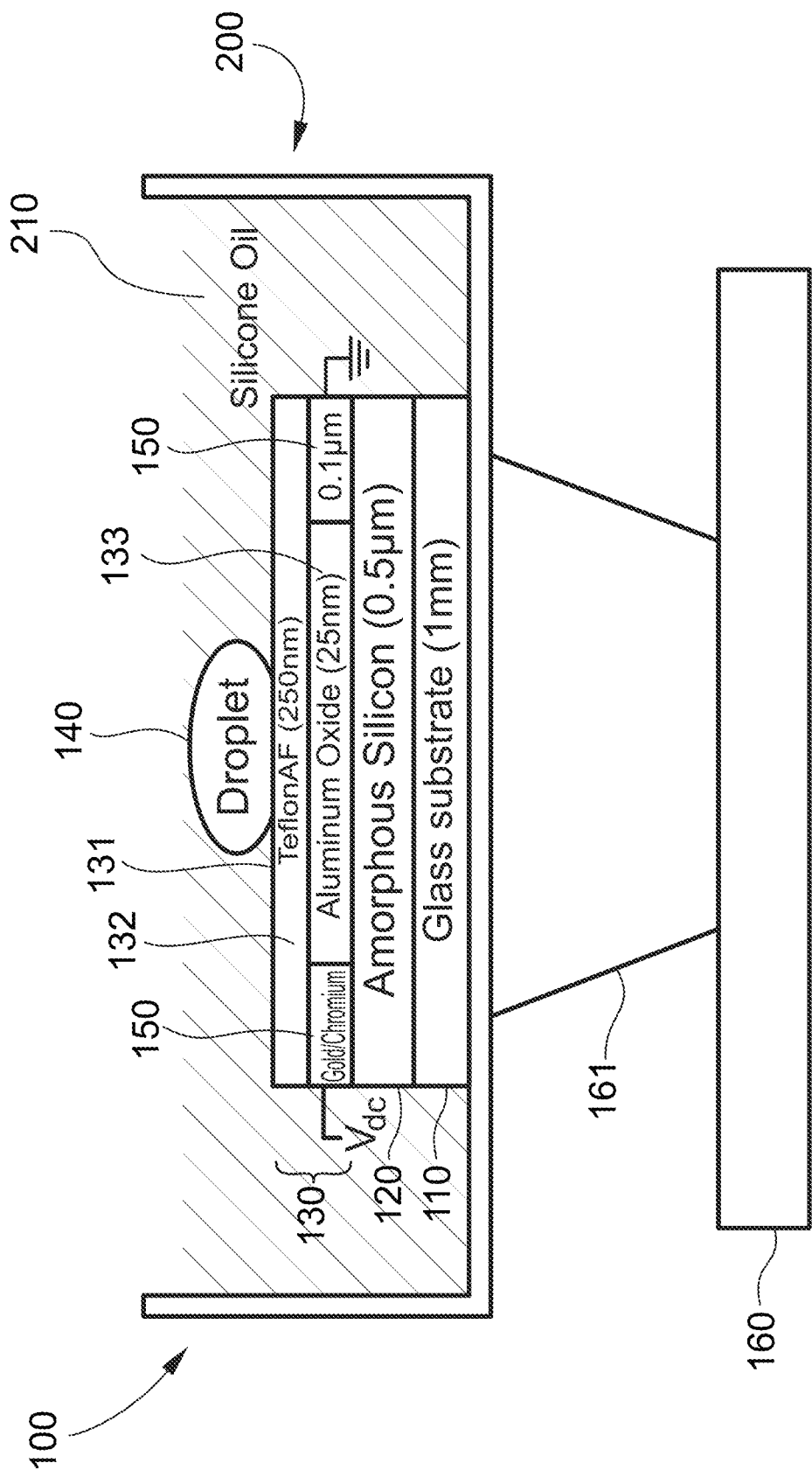
FIG. 1 illustrates a cross-sectional view of a single-sided microfluidic device according to one embodiment described herein.

Embodiments described herein can be understood more readily by reference to the following detailed description, examples and drawings and their previous and following descriptions. Elements, apparatus and methods described herein, however, are not limited to the specific embodiments presented in the detailed description, examples and drawings. It should be recognized that these embodiments are merely illustrative of the principles of the present invention. Numerous modifications and adaptations will be readily apparent to those of skill in the art without departing from the spirit and scope of the invention.

In addition, all ranges disclosed herein are to be understood to encompass any and all subranges subsumed therein. For example, a stated range of "1.0 to 10.0" should be considered to include any and all subranges beginning with a minimum value of 1.0 or more and ending with a maximum value of 10.0 or less, e.g., 1.0 to 5.3, or 4.7 to 10.0, or 3.6 to 7.9.

All ranges disclosed herein are also to be considered to include the end points of the range, unless expressly stated otherwise. For example, a range of "between 5 and 10" should generally be considered to include the end points 5 and 10.

Further, when the phrase "up to" is used in connection with an amount or quantity, it is to be understood that the amount is at least a detectable amount or quantity. For example, a material present in an amount "up to" a specified amount can be present from a detectable amount and up to and including the specified amount.

I. Single-sided Microfluidic Devices

In one aspect, single-sided digital microfluidic devices are described herein. A single-sided microfluidic device described herein can also be referred to as an open microfluidic device. Further, a single-sided or open microfluidic device described herein can differ from a two-sided or closed device wherein a liquid is disposed between two surfaces rather than on a single hydrophobic surface.

In some embodiments, a single-sided microfluidic device described herein comprises a substrate, a photoconductive layer positioned over the substrate, electrical contacts in electrical communication with the photoconductive layer, and a dielectric assembly positioned over the photoconductive layer. The dielectric assembly comprises a hydrophobic surface for receiving a liquid. Moreover, a dielectric assembly of a device described herein can be formed from a single hydrophobic layer or can comprise multiple layers.

Further, in some embodiments, the dielectric assembly of a device described herein has an effective capacitance of about 10 $\mu F/m^2$ to about 10,000 $\mu F/m^2$, about 10 $\mu F/m^2$ to about 5000 $\mu F/m^2$, about 10 $\mu F/m^2$ to about 1000 $\mu F/m^2$, about 30 $\mu F/m^2$ to about 500 $\mu F/m^2$, or about 50 $\mu F/m^2$ to about 500 $\mu F/m^2$. In some embodiments, the dielectric assembly of a device described herein has an effective capacitance of about 10 $\mu F/m^2$ to about 100 $\mu F/m^2$, about 30 $\mu F/m^2$ to about 300 $\mu F/m^2$, or about 30 $\mu F/m^2$ to about 150 $\mu F/m^2$. The effective capacitance of a dielectric assembly described herein can be measured or calculated in any manner not inconsistent with the objectives of the present invention. For example, when the dielectric assembly comprises multiple layers including a first hydrophobic dielectric material layer and a second dielectric material layer, the effective capacitance can be expressed according to equation (1):

$$C_{effective} = \varepsilon_0 \left[ \frac{\varepsilon_{di}\varepsilon_{hy}}{(\varepsilon_{di}t_{hy}) + (\varepsilon_{hy}t_{di})} \right], \quad (1)$$

wherein $C_{effective}$ is the effective capacitance per unit area of the dielectric assembly, $\varepsilon_0$ is the vacuum permittivity, $\varepsilon_{hy}$ and $\varepsilon_{di}$ are the dielectric constants (static relative permittivities) of the hydrophobic dielectric material and the second dielectric material, respectively, and $t_{hy}$ and $t_{di}$ are the thicknesses of the hydrophobic dielectric material layer and the second dielectric material layer, respectively.

In some embodiments, a single-sided microfluidic device described herein further comprises a radiation source. Such a single-sided microfluidic device, in some embodiments, can have a low threshold voltage. The threshold voltage of a device, for reference purposes herein, can be the lowest voltage at which droplet motion or translation on the plane of the hydrophobic dielectric layer of the device is observed. Moreover, the threshold voltage can be a direct current (DC) voltage. It is also possible for a threshold voltage described herein to be an alternating current (AC) voltage. In some embodiments, a single-sided device described herein can have a threshold voltage of less than 1 kV (DC), less than about 600 V (DC), or less than about 100 V (DC). In some embodiments, a single-sided device described herein has a threshold voltage between about 10 V (DC) and about 1000 V (DC), between about 30 V (DC) and about 600 V (DC), between about 50 V (DC) and about 600 V (DC), or between about 50 V (DC) and about 150 V (DC).

Further, in some instances, a single-sided device can have a threshold voltage recited herein when the radiation source provides radiation at an intensity of less than about 4000 lumens, less than about 3600 lumens, less than about 500 $cd/m^2$, less than about 400 $cd/m^2$, less than about 350 $cd/m^2$, less than about 300 $cd/m^2$. A lumen (lm), for reference purposes herein, can in some cases be an "ANSI" lumen (measured as defined in the document IT7.215 (1992)). In some embodiments, a device described herein exhibits a threshold voltage of about 50 V (DC) to about 600 V (DC) at an illumination intensity between about 1000 lm and about 4000 lm, between about 1000 lm and about 3800 lm, between about 2000 lm and about 4000 lm, between about 2500 lm and about 4000 lm, or between about 2500 lm and about 3800 lm. In other embodiments, a device described herein exhibits a threshold voltage of about 40 V (DC) to about 600 V (DC) at an illumination intensity between about 50 $cd/m^2$ and about 500 $cd/m^2$, between about 50 $cd/m^2$ and about 400 $cd/m^2$, between about 100 $cd/m^2$ and about 400 $cd/m^2$, between about 150 $cd/m^2$ and about 350 $cd/m^2$, or between about 200 $cd/m^2$ and about 400 $cd/m^2$.

The threshold voltage of a single-sided microfluidic device described herein, in some cases, can be affected by the environment of the device as well as by the illumination intensity. In some embodiments, for instance, the threshold voltage of a single-sided microfluidic device described herein is reduced by immersing one or more components of the device in a hydrophobic medium such as a silicone oil bath, as described further hereinbelow. In some embodiments, a single-sided microfluidic device described herein further comprises a hydrophobic liquid medium in contact with the substrate, photoconductive layer, electrical contacts, and/or dielectric assembly of the device. Further, in some cases, one or more of the foregoing components of a device described herein are disposed in or submerged under the hydrophobic liquid medium. In some embodiments, a device described herein exhibits a threshold voltage described herein when one or more of the foregoing components of the device is disposed in or submerged under a hydrophobic liquid medium such as silicone oil.

A radiation source of a microfluidic device described herein, in some instances, can be used to project an image onto the photoconductive layer of the device, as described further hereinbelow. Thus, in some embodiments, a single-sided microfluidic device described herein further comprises an image projected onto the photoconductive layer with the radiation source. In some such embodiments, the image can serve as a virtual electrode of the device. Moreover, in some embodiments, the image can have a shape configured to contain the droplet of liquid during movement of the droplet on the hydrophobic surface. Any shape not inconsistent with the objectives of the present invention may be used. In some embodiments, for example, an image comprises a polygon or a curved shape such as a crescent, circle, or ellipse. In some cases, the image comprises a union or intersection of a polygon and a curved shape. For example, in some instances, an image comprises a shape formed from both curved lines and straight line segments. Moreover, in some cases, an image comprises a hollow or "frame" shape, such as a rectangular, elliptical, or circular "picture frame" or "donut" type shape. In some embodiments, an image comprises a shape having a first leg, a second leg, and a third leg connecting the first and second legs. Further, in some cases, the first and second legs are substantially parallel to one another and the third leg is substantially perpendicular to the first and second legs. Thus, in some embodiments, an image described herein can be substantially U-shaped or H-shaped. In some embodiments, an image has a V-shape.

Moreover, in some instances, the ratio of the radius of a droplet of liquid disposed on the hydrophobic surface to a width of an image projected onto the photoconductive layer is between about 0.67 and about 2.0 or between about 0.85 and about 1.5. In some embodiments, the ratio of the radius of the droplet to a width of the image is between about 0.9 and about 1.3, between about 0.9 and about 1.2, or between about 0.95 and about 1.15.

In addition, in some embodiments, the electrical contacts of a microfluidic device described herein are non-collinear. Non-collinear electrical contacts, for reference purposes herein, do not all lie along the same straight line or cannot be connected by a single straight line.

For example, in some cases, the electrical contacts are arranged in pairs. The pairs, in some embodiments, are diametrically opposed to one another. Any number of pairs of electrical contacts can be used. For example, in some cases, a device comprises at least three pairs of electrical contacts diametrically opposed to one another. In some embodiments, a device comprises at least four pairs, at least five pairs, or at least six pairs of electrical contacts diametrically opposed to one another. Alternatively, in other instances, non-collinear electrical contacts are not arranged in pairs but are instead arranged in a different non-collinear configuration. For example, in some cases, three electrical contacts are separated from one another by angles of about 120 degrees, thus providing a triangular-type configuration of electrical contacts. Further, in some embodiments comprising non-collinear electrical contacts configured as described herein, the electrical contacts are positioned to permit liquid droplet movement in the lateral (x) and vertical (y) dimensions and combinations thereof. Moreover, the liquid droplet, in some cases, can be moved in any arbitrary direction on the xy-plane of the hydrophobic surface.

Turning now to components of devices, single-sided microfluidic devices described herein comprise a substrate. Any substrate not inconsistent with the objectives of the present invention may be used. In some embodiments, a substrate is radiation transmissive. A radiation transmissive substrate, in some embodiments, transmits rather than reflects or absorbs radiation of a desired wavelength. For example, in some embodiments, a radiation transmissive substrate exhibits optical transparency in the visible region of the electromagnetic spectrum, such as between 450 nm and 750 nm. In some embodiments, a radiation transmissive substrate exhibits optical transparency in the infrared (IR) region of the electromagnetic spectrum, including in one or more of the near-IR (NIR, 750 nm-1.4 µm), short-wavelength IR (SWIR, 1.4-3 µm), mid-wavelength IR (MWIR, 3-8 µm), and long-wavelength IR (LWIR, 8-15 µm). In some embodiments, a radiation transmissive substrate exhibits optical transparency in the ultraviolet (UV) region of the electromagnetic spectrum, including in one or more of the Ultraviolet A (UVA, 315-400 nm), Ultraviolet B (UVB, 280-315 nm), and Ultraviolet C (UVC, 100-280 nm). Optical transparency in a region described herein can comprise an optical transparency of at least about 60 percent, at least about 70 percent, at least about 80 percent, at least about 90, or at least about 95 percent in the region, such as between 450 nm and 750 nm or between 750 nm and 1.4 µm. In some embodiments, the radiation transmission profile of a substrate described herein is selected based on a radiation absorption profile of a photoconductive layer of the device. In some cases, for instance, a substrate is chosen to permit the transmission of radiation that can be absorbed by the photoconductive layer, thus providing optoelectric activation of the device.

A substrate described herein can be formed of any material not inconsistent with the objectives of the present invention. In some embodiments, for example, a substrate is formed of a glass such as a glass made of soda-lime, a borosilicate, an aluminosilicate, a titanium silicate, pure silica, or quartz. Moreover, it is also possible for the substrate of a device described herein to be formed of the same material as the photoconductive layer of the device, as described further below.

A substrate of a microfluidic device described herein can also have any thickness not inconsistent with the objectives of the present invention. In some embodiments, for instance, a substrate has a thickness between about 500 nm and about 1 cm. In some embodiments, a substrate has a thickness between about 1 µm and about 1 cm, between about 500 µm and about 1 cm, between about 500 µm and about 50 mm, or between about 500 µm and about 5 mm.

Single-sided microfluidic devices described herein also comprise a photoconductive layer. The photoconductive layer can be positioned over the substrate. However, as described above, it is also possible for the photoconductive layer to be formed of the same material as the substrate, such that there is not a separate and distinct substrate. Instead, in some such embodiments, the photoconductive layer can be a photoconductive base or substrate for additional components of the device.

Any photoconductive layer not inconsistent with the objectives of the present invention may be used. Moreover, a photoelectric layer, for reference purposes herein, comprises a layer that exhibits an electric effect (such as increased conductivity or photoconductivity) in response to irradiation with electromagnetic radiation. For example, in some embodiments, a photoconductive layer described herein is a photoelectric layer and/or exhibits a photoelectric effect.

In addition, in some embodiments, a photoconductive layer exhibits sufficient optical transparency with respect to a desired radiation source to permit the radiation source to project an image onto the photoconductive layer as described herein, including under backside illumination. In some embodiments, for instance, a photoconductive layer exhibits an optical transparency of at least about 30 percent in a region of the electromagnetic spectrum described hereinabove, such as between 450 nm and 750 nm or in the NIR. In some embodiments, a photoconductive layer exhibits an optical transparency between about 30 percent and about 95 percent, between about 30 percent and about 80 percent, or between about 30 percent and about 60 percent in a region of the electromagnetic spectrum described hereinabove.

A photoconductive layer of a device described herein can be formed of any material and have any thickness not inconsistent with the objectives of the present invention. In some embodiments, for example, a photoconductive layer is formed of a semiconductor material such as an inorganic semiconductor material or an organic semiconductor material. In some embodiments, a photoconductive layer is formed of a Group IV semiconductor material such as silicon or germanium, a Group II-VI semiconductor material such as ZnS or CdSe, or a Group III-V semiconductor material such as GaN or InAs. Such semiconductor materials, if desired, can be binary, ternary, or quaternary. In some embodiments, a photoconductive layer is formed of a Group I/III/VI material such as copper indium gallium selenide (CIGS). Moreover, a semiconductor material forming a photoconductive layer can be single crystalline, polycrystalline, or amorphous. For example, in some embodiments, a photoconductive layer is formed of amorphous silicon (a-Si) such as hydrogenated amorphous silicon (a-Si:H) or fluorinated amorphous silicon (a-Si:F).

In some embodiments, a photoconductive layer of a device described herein has a thickness between about 100 nm and about 5 µm. In some embodiments, a photoconductive layer has a thickness between about 500 nm and about 3 µm, between about 500 nm and about 2 µm, between about 500 nm and about 2 µm, or between about 500 nm and about 1.5 µm.

Single-sided microfluidic devices described herein also comprise a dielectric assembly positioned over the photoconductive layer. The dielectric assembly comprises a hydrophobic surface for receiving a liquid, which can include one or more droplets. Further, in some embodiments, the liquid is a hydrophilic liquid such as an aqueous liquid. In some cases, a liquid is a biological liquid such as blood. A hydrophobic surface, in some embodiments, exhibits a contact angle with a liquid droplet described herein of at least about 90 degrees. In some embodiments, a hydrophobic surface exhibits a contact angle with a liquid droplet of greater than 90 degrees.

A dielectric assembly described herein, in some embodiments, has an effective capacitance of about 10 $\mu F/m^2$ to about 10,000 $\mu F/m^2$, as described by equation (1) above. In some cases, a dielectric assembly has an effective capacitance of about 10 $\mu F/m^2$ to about 5000 $\mu F/m^2$, about 10 $\mu F/m^2$ to about 1000 $\mu F/m^2$, about 50 $\mu F/m^2$ to about 500 $\mu F/m^2$, about 100 $\mu F/m^2$ to about 1000 $\mu F/m^2$, about 100 $\mu F/m^2$ to about 500 $\mu F/m^2$, about 200 $\mu F/m^2$ to about 1000 $\mu F/m^2$, or about 500 $\mu F/m^2$ to about 1000 $\mu F/m^2$, as described by equation (1). In some instances, a dielectric assembly has an effective capacitance of about 10 $\mu F/m^2$ to about 300 $\mu F/m^2$, about 30 $\mu F/m^2$ to about 150 $\mu F/m^2$, or about 30 $\mu F/m^2$ to about 100 $\mu F/m^2$, as described by equation (1).

In addition, in some embodiments, a dielectric assembly having an effective capacitance recited herein also has a reduced thickness compared to other dielectric assemblies. For example, in some embodiments, a dielectric assembly having an effective capacitance of about 10 $\mu F/m^2$ to about 1000 $\mu F/m^2$ has a total average thickness between about 20 nm and about 2000 nm, between about 20 nm and about 1500 nm, between about 30 nm and about 1300 nm, between about 50 nm and about 2000 nm, between about 50 nm and about 1000 nm, between about 100 nm and about 1500 nm, between about 100 nm and about 500 nm, between about 500 nm and about 2000 nm, or between about 500 nm and about 1500 nm. A microfluidic device comprising such a dielectric assembly, in some embodiments, can exhibit a reduced threshold voltage and/or higher droplet transport speeds, including at low illumination intensity.

A dielectric assembly of a microfluidic device described herein can be formed of any material and have any structure not inconsistent with the objectives of the present invention. For example, in some embodiments, a dielectric assembly is formed from a single hydrophobic layer, such as a single hydrophobic polymer layer. In some embodiments, a single hydrophobic layer is formed of a dielectric material having a dielectric constant of at least about 3 or at least about 5.

A dielectric assembly of a microfluidic device described herein can also comprise multiple layers. In some embodiments comprising multiple layers, at least two layers of the dielectric assembly are formed from different dielectric materials. For example, in some embodiments, at least one layer of the dielectric assembly is formed from a hydrophobic first dielectric material and at least one layer of the dielectric assembly is formed from a second dielectric material having a dielectric constant of at least about 3, at least about 5, or at least about 7. In some embodiments, a second dielectric material has a dielectric constant between about 3 and about 27, between about 3 and about 15, between about 5 and about 12, between about 5 and about 10, or between about 7 and about 10. A second dielectric material can be hydrophobic or hydrophilic.

Further, in some embodiments, a hydrophobic first dielectric material has a dielectric constant of at least about 1.5 or at least about 2. In some embodiments, a hydrophobic first dielectric material has a dielectric constant between about 1 and about 10, between about 1 and about 5, between about 1.5 and about 5, between about 2 and about 5, or between about 2 and about 4. Moreover, in some embodiments, a hydrophobic first dielectric material described herein has a lower dielectric constant than a second dielectric material described herein.

A hydrophobic first dielectric material of such a dielectric assembly, in some embodiments, can comprise an organic material such as an organic polymeric material. In some embodiments, a hydrophobic first dielectric material comprises a fluoropolymer such as Cytop or Teflon. In some cases, a hydrophobic first dielectric material comprises a polymeric hydrocarbon or a parylene. A second dielectric material, in some embodiments, comprises an inorganic material. For example, in some embodiments, at least one of the layers of the dielectric assembly is formed of a ceramic material such as a metal oxide or metal nitride. A metal oxide, in some embodiments, comprises alumina ($Al_2O_3$), titania ($TiO_2$), zirconia ($ZrO_2$), a hafnium oxide such as $HfO_2$, a tantalum oxide such as $Ta_2O_5$, or yttrium oxide ($Y_2O_3$). In some embodiments, at least one of the layers of the dielectric assembly is formed of a nitride such as $Si_3N_4$, a silicate such as $HfSiO_4$, or a barium strontium titanate ($Ba_xSr_{(1-x)}TiO_3$).

In addition, when a dielectric assembly comprises multiple layers, the layers can have any thicknesses not inconsistent with the objectives of the present invention. For example, in one exemplary embodiment, a layer formed from a hydrophobic first dielectric material has an average thickness between about 10 nm and about 1700 nm and a layer formed from a second dielectric material having a dielectric constant of at least about 3 or at least about 5 has an average thickness between about 10 nm and about 200 nm. In other embodiments, a layer formed from a hydrophobic first dielectric material has an average thickness between about 20 nm and about 1700 nm, between about 30 nm and about 1500 nm, between about 50 nm and about 500 nm, between about 50 nm and about 300 nm, or between about 150 nm and about 350 nm and a layer formed from a second dielectric material having a dielectric constant of at least about 3 or at least about 5 has an average thickness between about 10 nm and about 50 nm, between about 10 nm and about 90 nm, between about 20 nm and about 150 nm, between about 30 nm and about 100 nm, or between about 50 nm and about 200 nm. Further, in some embodiments, a dielectric assembly has a total average thickness between about 20 nm and about 2000 nm.

Single-sided microfluidic devices described herein also comprise electrical contacts in electrical communication with the photoconductive layer. The electrical contacts can be formed of any material and have any physical dimensions not inconsistent with the objectives of the present invention. In some embodiments, for instance, electrical contacts are formed from a highly conductive material such as a metal or metal alloy or mixture of metals. For example, in some embodiments, electrical contacts are formed from chromium, gold, silver, copper, aluminum, indium, or a combination or mixture thereof. In some embodiments, electrical contacts are formed from a conductive oxide such as a transparent conductive oxide (TCO). Non-limiting examples of transparent conductive oxides suitable for use in some embodiments described herein include indium tin oxide (ITO), gallium indium tin oxide (GITO), and zinc indium tin oxide (ZITO). Further, in some embodiments, electrical contacts described herein have a thickness between about 10 nm and about 1 mm or between about 50 nm and about 1 µm. In some embodiments, electrical contacts described herein have a thickness between about 50 nm and about 500 nm.

Single-sided microfluidic devices described herein, in some embodiments, also comprise a radiation source. Any radiation source not inconsistent with the objectives of the present invention may be used. In some embodiments, for instance, the radiation source is a flat panel display such as a liquid crystal display (LCD) or optoelectronic screen. A flat panel display, in some embodiments, is a laptop computer screen or a tablet computer screen such as an iPad or Android tablet screen. In other embodiments, the flat panel display comprises a screen of a wireless communication device such as a mobile phone. In some cases, the radiation source is a data projector.

Moreover, in some embodiments, a radiation source described herein provides an illumination intensity between about 1000 lm and about 4000 lm, between about 1000 lm and about 3800 lm, between about 2000 lm and about 4000 lm, between about 2500 lm and about 4000 lm, or between about 2500 lm and about 3800 lm, based on the illuminated area of the photoconductive layer. In some embodiments, a radiation source provides an illumination intensity between about 50 $cd/m^2$ and about 500 $cd/m^2$, between about 50 $cd/m^2$ and about 400 $cd/m^2$, between about 100 $cd/m^2$ and about 400 $cd/m^2$, between about 150 $cd/m^2$ and about 350 $cd/m^2$, or between about 200 $cd/m^2$ and about 400 $cd/m^2$. Additionally, in some cases, a radiation source provides radiation in the visible region of the electromagnetic spectrum, such as between 450 nm and 750 nm. In some embodiments, a radiation source provides radiation in the infrared (IR) region of the electromagnetic spectrum, including in one or more of the near-IR (NIR, 750 nm-1.4 µm), short-wavelength IR (SWIR, 1.4-3 µm), mid-wavelength IR (MWIR, 3-8 µm), and long-wavelength IR (LWIR, 8-15 µm). In some embodiments, a radiation source provides radiation in the ultraviolet (UV) region of the electromagnetic spectrum, including in one or more of the Ultraviolet A (UVA, 315-400 nm), Ultraviolet B (UVB, 280-315 nm), and Ultraviolet C (UVC, 100-280 nm).

Single-sided microfluidic devices described herein can have any combination of components, properties, and features described herein not inconsistent with the objectives of the present invention. For example, a single-sided microfluidic device described herein can include any dielectric assembly described herein in combination with any substrate, photoconductive layer, and/or radiation source described herein. Similarly, a single-sided microfluidic device described herein can include any configuration of electrical contacts described herein in combination with any dielectric assembly described herein. A device can also include any image projected onto a photoconductive layer described herein in combination with any other property or feature not inconsistent with the objectives of the present invention.

Some exemplary embodiments of single-sided microfluidic devices will now be further described with reference to the drawings. FIG. 1 illustrates a cross-sectional view of a single-sided microfluidic device according to one embodiment described herein. Device (100) comprises a substrate (110) formed of glass and a photoconductive layer (120) formed of amorphous silicon positioned over the substrate (110). The device (100) further comprises a dielectric assembly (130) positioned over the photoconductive layer (120). The dielectric assembly (130) comprises a hydrophobic surface (131) for receiving a droplet of liquid (140). Further, the dielectric assembly (130) comprises multiple layers. Specifically, the dielectric assembly (130) includes two layers (132, 133) formed from different dielectric materials. A first dielectric material layer (132) is formed from a first hydrophobic dielectric material (Teflon AF), and a second dielectric material layer (133) is formed from a second dielectric material ($Al_2O_3$) having a dielectric constant of at least about 3 or at least about 5. More particularly, the dielectric constant of alumina is about 9. By comparison, the dielectric constant of Teflon AF is about 2.

In addition, the microfluidic device (100) of FIG. 1 further comprises electrical contacts (150) formed from gold and chromium. The electrical contacts (150) are in electrical communication with the photoconductive layer (120). More specifically, in the embodiment of FIG. 1, the electrical contacts (150) are disposed on the photoconductive layer (120) and in electrical contact with the photoconductive layer (120).

The device (100) of FIG. 1 also includes a radiation or optical source (160). The radiation source (160) is positioned beneath the substrate (110) to provide backside illumination (161) to the substrate (110) and photoconductive layer (120). The illumination (161) is illustrated schematically in FIG. 1 as a spreading illumination beam. However, as understood by one of ordinary skill in the art, the shape of the illumination (161) provided by a radiation source (160) is not particularly limited to the shape depicted in FIG. 1.

Moreover, as illustrated in FIG. 1, some components of the microfluidic device (100) are disposed in a petri dish (200) containing silicone oil (210). However, in other embodiments, immersion of device components in a hydrophobic medium such as silicone oil is not used. The use of a hydrophobic medium such as a silicone oil bath, in some cases, can affect the threshold voltage of a device described herein.

FIG. 2 illustrates a plan view of a microfluidic device according to one embodiment described herein. The device (100) of FIG. 2 is similar to the device illustrated in FIG. 1 and includes an amorphous silicon photoconductive layer and a multi-layer dielectric assembly that comprises an alumina layer and a Teflon AF layer and provides a hydrophobic surface (131). In addition, the device (100) of FIG. 2 includes four electrical contacts ($CX_1, CX_2, CY_1, CY_2$) electrically connected to the underlying photoconductive layer. The electrical contacts ($CX_1, CX_2, CY_1, CY_2$) are arranged in pairs diametrically opposed to one another. A first pair of collinear electrical contacts diametrically opposed to one another ($CX_1, CX_2$) defines an x-direction in the plane of the paper in FIG. 2, which is parallel to the plane of the photoconductive layer and the plane of the hydrophobic surface (131) of the dielectric assembly of the device (100). A second pair of collinear electrical contacts diametrically opposed to one another ($CY_1, CY_2$) defines a y-direction. The first pair ($CX_1, CX_2$) and second pair ($CY_1, CY_2$) of collinear electrical contacts are separated by a non-zero angle ($\theta$) in the plane of the hydrophobic surface (131) and are thus not collinear with one another. As illustrated in FIG. 2, the non-zero angle ($\theta$) is about 90 degrees. However, other configurations are also possible. In some embodiments, for instance, first and second pairs of collinear electrical contacts are separated by an angle ($\theta$) of less than 90 degrees or between about 45 degrees and about 90 degrees. For reference purposes herein, it is to be understood that the angle ($\theta$) is measured in the plane of the hydrophobic surface (131), as opposed to some other plane, such as a plane perpendicular to the plane of the hydrophobic surface (131).

FIG. 3 illustrates a plan view of a microfluidic device according to another embodiment described herein. The device (100) of FIG. 3 comprises three pairs of diametrically opposed electrical contacts (C1, C2, C3, C4, C5, C6). The first pair of collinear, diametrically opposed electrical contacts (C1, C4), the second pair of collinear, diametrically opposed electrical contacts (C2, C5), and the third pair of collinear, diametrically opposed electrically contacts (C3, C6) are not collinear with one another but are instead separated from one another by non-zero angles ($\theta_1, \theta_2, \theta_3$) in the plane of the hydrophobic surface (131). Specifically, the first pair of contacts (C1, C4) are separated from the second pair of contacts (C2, C5) by the angle $\theta_2$, the second pair of contacts (C2, C5) are separated from the third pair of contacts (C3, C6) by the angle $\theta_3$, and the third pair of contacts (C3, C6) are separated from the first pair of contacts (C1, C4) by the angle $\theta_1$. Moreover, as illustrated in FIG. 3, the three pairs of collinear electrical contacts are evenly distributed about the circumference or perimeter of the hydrophobic surface (131), such that $\theta_1 \approx \theta_2 \approx \theta_3$. Other configurations of diametrically opposed pairs of electrical contacts are also possible. In general, pairs of diametrically opposed electrical contacts can be separated by any angle in the plane of the hydrophobic surface (131) not inconsistent with the objectives of the present invention. In some embodiments, pairs of electrical contacts are separated by an angle between about 10 degrees and about 60 degrees in the plane of the hydrophobic surface (131).

As described hereinabove, it is also possible for non-collinear electrical contacts described herein to not be arranged in pairs of diametrically opposed contacts. For example, an odd number of electrical contacts, such as three electrical contacts, can be distributed about the circumference or perimeter of a hydrophobic surface described herein such that the electrical contacts are separated from one another by non-zero angles in the plane of the hydrophobic surface (e.g., angles of about 120 degrees each). An even number of electrical contacts can also be distributed about the circumference or perimeter of a hydrophobic surface in a similar manner without being arranged in pairs of diametrically opposed contacts. Further, any odd or even number of electrical contacts not inconsistent with the objectives of the present invention may be used. For example, in some cases, a microfluidic device described herein comprises four non-collinear electrical contacts, five non-collinear electrical contacts, six non-collinear electrical contacts, seven non-collinear electrical contacts, eight non-collinear electrical contacts, or nine non-collinear electrical contacts arranged as described herein. In some embodiments, a microfluidic device described herein comprises more than 10 or more than 20 non-collinear electrical contacts arranged in a configuration described herein.

Microfluidic devices comprising non-collinear electrical contacts, including in a configuration illustrated in FIG. 2 or FIG. 3, in some embodiments, can permit liquid droplet movement in both the lateral (x) and vertical (y) dimensions, as well as combinations thereof. Thus, one or more liquid droplets can be moved in any arbitrary direction on the xy-plane of the hydrophobic surface of the dielectric assembly of such a device or along any vector of lateral (x) and vertical (y) coordinates. Moreover, in contrast to some previous microfluidic devices, such a device described herein, in some embodiments, can move a droplet in any arbitrary direction on the xy-plane at the same speed. In other words, the speed of droplet movement on the hydrophobic surface can be substantially independent of the direction of movement in the xy-plane.

II. Methods of Moving a Droplet of Liquid

In another aspect, methods of moving a droplet of liquid are described herein. In some embodiments, a method of moving a droplet of liquid comprises moving a droplet of liquid using a single-sided microfluidic device described hereinabove in Section I. Any microfluidic device described in Section I may be used. For example, in some instances, a method of moving a droplet of liquid comprises disposing the droplet on a hydrophobic surface of a dielectric assembly of a single-sided microfluidic device, the dielectric assembly having an effective capacitance of about 10 $\mu F/m^2$ to about 10,000 $\mu F/m^2$ and being positioned over a photoconductive layer in electrical communication with electrical contacts. Other dielectric assemblies described hereinabove in Section I may also be used. The method further comprises applying a voltage to the electrical contacts; projecting an image onto the photoconductive layer with a radiation source, the image partially overlapping the droplet; and moving the droplet on the hydrophobic surface by moving the image.

Turning now to steps of methods, methods of moving a droplet of liquid described herein comprise disposing the droplet on a hydrophobic surface of a dielectric assembly of a single-sided microfluidic device. Any droplet of liquid not inconsistent with the objectives of the present invention may be used. In some embodiments, for instance, the liquid is a hydrophilic liquid such as an aqueous liquid. In some cases, a liquid is a biological liquid such as blood. Moreover, as understood by one of ordinary skill in the art, methods of moving a droplet described herein can also be used to move a plurality of droplets. Further, a plurality of droplets can be moved simultaneously or non-simultaneously or sequentially. For example, in some cases, a plurality of droplets are moved simultaneously in the same direction or in different directions, as desired by a user. Moreover, in some instances, a plurality of droplets can be moved so as to combine or mix with one another, forming a smaller number of larger droplets or a single larger droplet.

Methods of moving a droplet of liquid described herein also comprise applying a voltage to the electrical contacts. A voltage can be applied to the electrical contacts in any manner not inconsistent with the objectives of the present invention. For example, in some cases, the electrical contacts comprise pairs of diametrically opposed electrical contacts and applying a voltage comprises applying a voltage to all of the pairs of electrical contacts simultaneously. In other embodiments, voltage is applied to only one pair of electrical contacts at a time or to only one electrical contact of a pair of contacts. In some cases, voltage is applied to only a first electrical contact of a first pair of electrical contacts and a second electrical contact of a second pair of electrical contacts. For example, a voltage can be applied to only electrical contacts $CX_1$ and $CY_1$ in the device (100) of FIG. 2, or only to electrical contacts C3 and C4 of the device (100) of FIG. 3. Alternatively, the electrical contacts can comprise non-collinear electrical contacts that are not arranged in pairs of diametrically opposed contacts and applying a voltage can comprise applying a voltage to all of the electrical contacts simultaneously or to less than all of the electrical contacts simultaneously. In general, voltage can be applied to any combination of electrical contacts not inconsistent with the objectives of the present invention, including in a time-dependent manner, such that any desired number and/or arrangement of electrical contacts are activated or deactivated at a desired time or in a desired sequence. Applying voltage to electrical contacts in this manner, in some embodiments, can facilitate droplet movement in a desired direction (such as in a direction parallel to the diameter of an activated pair of electrical contacts or a direction in between a first individually activated electrical contact and a second individually activated contact). Applying voltage to electrical contacts in this manner can also facilitate droplet movement in a desired direction at a desired time and at a desired speed. In addition, an applied voltage described herein can have a small magnitude compared to some other devices. In some embodiments, for instance, a voltage of less than 1 kV (DC) is applied to the electrical contacts. In some embodiments, a voltage of less than about 600 V (DC), less than about 200 V (DC), or less than about 100 V (DC) is applied to the electrical contacts. In some embodiments, a voltage between about 10 V (DC) and about 1 kV (DC), between about 30 V (DC) and about 600 V (DC), or between about 50 V (DC) and about 150 V (DC) is applied to the electrical contacts. Further, in some embodiments, the magnitude of the applied voltage is selected based on the radiation source used to project an image onto the photoconductive layer. For example, in some embodiments wherein the radiation source is a data projector, a voltage of about 50 V is applied. In other embodiments wherein the radiation source is an optoelectronic screen, a voltage of about 600 V is applied.

Methods described herein also comprise projecting an image onto the photoconductive layer of a microfluidic device using a radiation source. Any radiation source not inconsistent with the objectives of the present invention may be used. In some embodiments, a radiation source comprises a radiation source described hereinabove in Section I. For example, in some embodiments, a radiation source is a flat panel display such as a liquid crystal display (LCD) or optoelectronic screen. A flat panel display can also be a laptop computer screen or a tablet computer screen such as an iPad screen. The flat panel display can also be a screen of a wireless communication device such as a mobile phone. In some embodiments, a radiation source is a data projector. Moreover, in some embodiments, a radiation source described herein provides an illumination intensity between about 2500 lm and about 4000 lm, based on the illuminated area of the photoconductive layer. In some embodiments, a radiation source provides an illumination intensity between about 100 $cd/m^2$ and about 400 $cd/m^2$, based on the illuminated area of the photoconductive layer.

In addition, projecting an image with a radiation source can be carried out in any manner not inconsistent with the objectives of the present invention. In some embodiments, for instance, an image is a substantially opaque or dark image projected by illuminating areas of the photoconductive layer surrounding the image without illuminating a dark area defining the image. As understood by one of ordinary skill in the art, such a dark or opaque image can be provided in various ways. For example, in some embodiments, a static or dynamic image is provided using a pre-defined illumination pattern or series of illumination patterns provided by the radiation source. For example, in some embodiments wherein the radiation source is an optoelectronic screen, an image described herein can be provided by displaying a desired pattern of relatively dark and light areas on the optoelectronic screen using a computer application, algorithm, or software that provides a graphical output to the optoelectronic screen. For example, in some cases, a Power Point or similar presentation program or a canvas-enabled JavaScript application can be used to provide an illumination pattern to an optoelectronic screen of a device capable of running the program or application. In addition, in some embodiments, a dark or substantially opaque image described herein can serve as a virtual electrode of the device.

Further, in some embodiments, an image described herein overlaps a droplet of liquid by an amount substantially equal to the radius of the droplet. In addition, an image projected as described herein can have any size and shape not inconsistent with the objectives of the present invention. For example, in some instances, an image has a shape configured to contain the droplet of liquid during movement of the droplet on the hydrophobic surface. In some embodiments, an image comprises a polygon or a curved shape such as a crescent, circle, or ellipse. In some instances, an image comprises a shape formed from both curved lines and straight line segments or a shape formed by the intersection of union of a polygon and a curved shape. Moreover, in some cases, an image comprises a hollow or "frame" shape, such as a rectangular, elliptical, or circular "picture frame" or "donut" type shape. In some embodiments, an image comprises a shape having a first leg, a second leg, and a third leg connecting the first and second legs. Further, in some cases, the first and second legs are substantially parallel to one another and the third leg is substantially perpendicular to the first and second legs. Thus, in some embodiments, an image described herein can be substantially U-shaped or H-shaped. In some embodiments, an image has a V-shape.

Moreover, in some instances, the ratio of the radius of the droplet of liquid to a width of an image projected onto the photoconductive layer is between about 0.67 and about 2.0 or between about 0.85 and about 1.5. In some embodiments, the ratio of the radius of the droplet to a width of the image is between about 0.9 and about 1.3, between about 0.9 and about 1.2, or between about 0.95 and about 1.15.

Methods described herein also comprise moving the droplet on the hydrophobic surface by moving the image. The image can be moved in any manner not inconsistent with the objectives of the present invention. In some embodiments, for instance, an image is moved by projecting the image with the radiation source using a pre-defined illumination pattern or series of illumination patterns, wherein the illumination pattern changes over time. Thus, an image described herein can be moved by projecting the image in a first location using a desired illumination pattern and then projecting the image in a second location differing from the first location by changing the illumination pattern. For example, in some embodiments wherein the radiation source is an optoelectronic screen, an image described herein can be moved by displaying a first pattern of relatively dark and light areas on the optoelectronic screen using a computer application, algorithm, or software that provides a graphical output to the optoelectronic screen, and then displaying a second pattern of relatively light and dark areas, wherein the first and second patterns differ. In this manner, the position of the image on the photoconductive layer can be moved. Further, as described herein, moving an image can cause corresponding movement of a droplet through an optoelectronic effect and/or a dielectrophoretic effect, including at an illumination intensity and/or applied voltage described herein.

Moreover, in some embodiments, a droplet can be moved in any arbitrary direction on the xy-plane of the hydrophobic surface. Further, in some cases, a droplet can be moved in any arbitrary direction on the xy-plane at the same speed. In other words, the speed of droplet movement on the hydrophobic surface can be substantially independent of the direction of movement in the xy-plane. In some embodiments, a droplet is moved at a speed up to 20 mm/s or up to 15 mm/s. In some embodiments, a droplet is moved at a speed between about 3 mm/s and about 20 mm/s, between about 5 mm/s and about 15 mm/s, or between about 7 mm/s and about 12 mm/s. Moreover, in some instances, a droplet is moved at a speed described herein at an optical illumination and/or applied voltage or threshold voltage described herein. For example, in some embodiments, a droplet is moved at a speed of about 12 mm/s at an optical illumination of about 3500 lm and an applied voltage of about 120 V (DC). In other cases, a droplet is moved at a speed of about 1.2 mm/s at an optical illumination of about 336 cd/m$^2$ and an applied voltage of about 570 V (DC).

Some exemplary embodiments of methods of moving a droplet of liquid will now be further described with reference to the drawings. FIGS. 4(a)-(c) illustrate a series of plan views of a microfluidic device suitable for carrying out a method of moving a droplet of liquid according to one embodiment described herein. As illustrated in FIG. 4(a), a 20-μL droplet of liquid (140) is disposed on a hydrophobic surface (131) of a dielectric assembly of a single-sided microfluidic device according to one embodiment described herein. Specifically, the device of FIG. 4(a) has a structure as illustrated in FIG. 3. In the embodiment of FIG. 4(a), a voltage is applied to the electrical contacts (not shown) of the device. In addition, an image (170) is projected onto the hydrophobic surface (131) of the dielectric assembly of the device with a data projector radiation source (not shown) through backside illumination. As illustrated in FIG. 4(a), the image (170) is dark or substantially opaque and partially overlaps the droplet (140).

FIGS. 4(b) and 4(c) illustrate the same image (170) and droplet (140) after moving the image (170) and droplet (140) on the hydrophobic surface (131). Specifically, the image (170), which serves as a virtual electrode of the microfluidic device, has been translated on the hydrophobic surface (131) and rotated by about 45 degrees in the plane of the hydrophobic surface (131). Thus, as illustrated in FIGS. 4(a)-(c), methods of moving a droplet of liquid described herein can comprise multi-axis movement of the droplet.

FIGS. 5(a)-(d) illustrate another series of plan views of a microfluidic device suitable for carrying out a method of moving a droplet described herein. As illustrated in FIG. 5(a), a 70-μL droplet of liquid (140) is disposed on a hydrophobic surface (131) of a dielectric assembly of a single-sided microfluidic device. The device of FIG. 5(a) has the same structure as the device of FIG. 4(a). In addition, the droplet movement illustrated in FIGS. 5(a)-(d) is carried out in a similar manner as the movement illustrated in FIGS. 4(a)-(c), except that in the embodiment of FIGS. 5(a)-(d), an image (170) is projected onto the surface (131) of the photoconductive layer of the device using an LCD screen instead of a data projector. FIGS. 5(b)-(d) illustrate the same image (170) and droplet (140) as in FIG. 5(a) after moving the image (170) and droplet (140) on the hydrophobic surface (131) using a JavaScript application. FIG. 5(a) illustrates the initial position of the droplet (140), and FIG. 5(d) illustrates the final position of the droplet (140). FIGS. 5(b) and 5(c) illustrate intermediate positions of the droplet (140). Again, the droplet movement illustrated in FIGS. 5(a)-(d) comprises multi-axis movement of the droplet.

Figure 6A:
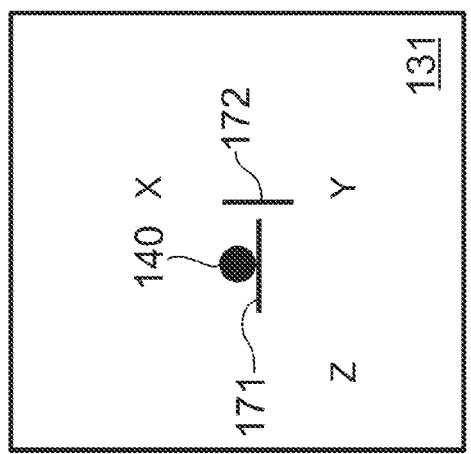
FIGS. 6(a)-(d) illustrate a method of moving a droplet of liquid according to one embodiment described herein.
Figure 6B:
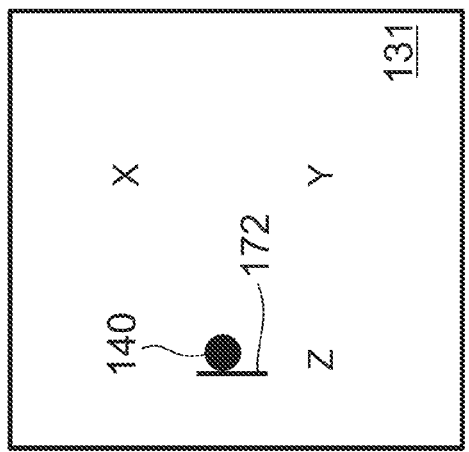
Figure 6C:
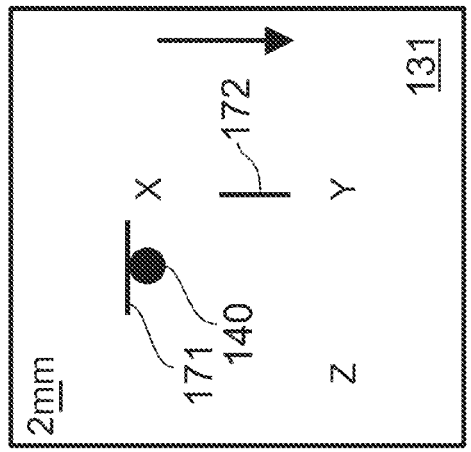
Figure 6D:
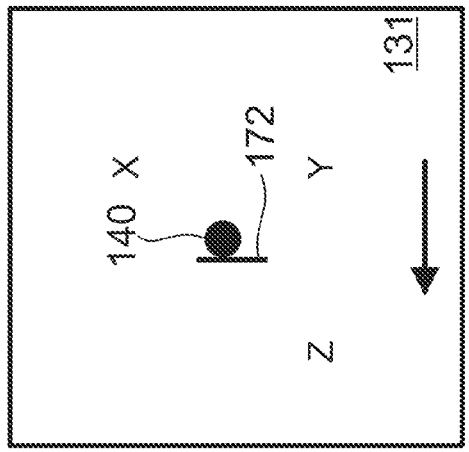

FIGS. 6(a)-(d) illustrate another series of plan views of a microfluidic device suitable for carrying out a method described herein. However, in the embodiment of FIGS. 6(a)-(d), two images or virtual electrodes (171, 172) are used instead of one image or virtual electrode. As illustrated in FIG. 6(a), a 10-μL droplet of liquid (140) is disposed on a hydrophobic surface (131) of a dielectric assembly of a single-sided microfluidic device according to one embodiment described herein. The device of FIG. 6(a) has the same structure as the device of FIG. 4(a). As illustrated in FIGS. 6(a)-(d), the droplet (140) is moved from an initial position (X) in the direction indicated by the large arrow in FIG. 6(a) to an intermediate position (Y) using a first image or virtual electrode (171) while the second image or virtual electrode (172) is kept stationary. Next, the first image or virtual electrode (171) is turned off by ceasing projection of that image (171), and the second image or virtual electrode (172) moves the droplet (140) from the intermediate position (Y) to a final position (Z) along the direction marked by the large arrow in FIG. 6(c).

Figure 7A:
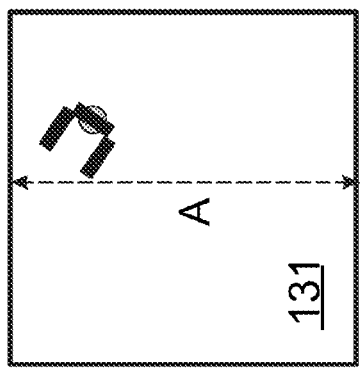
FIGS. 7(a)-(d) illustrate a method of moving a droplet of liquid according to one embodiment described herein.
Figure 7B:
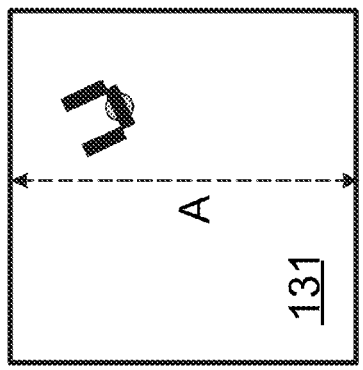
Figure 7C:
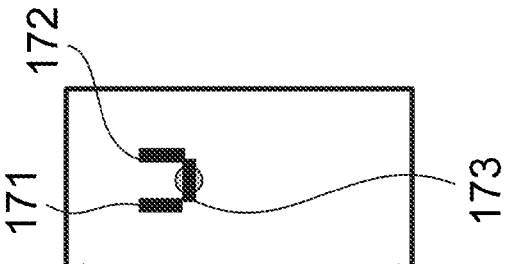
Figure 7D:
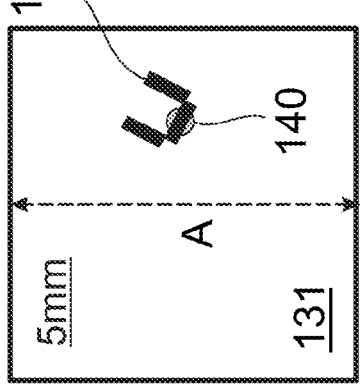

FIGS. 7(a)-(d) illustrate another method of moving a droplet described herein. As illustrated in FIG. 7(a), a 20-µL droplet of liquid (140) is disposed on a hydrophobic surface (131) of a dielectric assembly of a single-sided microfluidic device according to one embodiment described herein. The device of FIG. 7(a) has the same structure as the device of FIG. 4(a). Specifically, the device of FIG. 7(a) includes two pairs of diametrically opposed electrical contacts (not shown). One of the pairs of electrical contacts has a diameter or axis parallel to the direction (A) in FIGS. 7(a)-(d). Moreover, in the embodiment illustrated in FIGS. 7(a)-(d), this pair of electrical contacts is activated by selective application of a voltage to these contacts only. The droplet (140) can be moved parallel to the axis (A), as shown moving from FIG. 7(a) to FIG. 7(b). The droplet (140) can also be moved in a direction about 30 degrees off-axis, as shown in FIG. 7(a) and moving from FIG. 7(b) to FIG. 7(c). The droplet (140) can also be moved in a direction about 60 degrees off-axis, as shown moving from FIG. 7(c) to FIG. 7(d). Such movement, in some cases, can be achieved by applying a voltage to only one electrical contact of a pair of electrical contacts, or to only a first electrical contact of a first pair of electrical contacts and a second electrical contact of a second pair of electrical contacts. For example, movement in a desired off-axis direction can be achieved by applying a voltage to only electrical contacts $CX_1$ and $CY_1$ in the device (100) of FIG. 2, or by applying a voltage to only electrical contacts C3 and C4 of the device (100) of FIG. 3.

In addition, again with reference to FIGS. 7(a)-(d), the image or virtual electrode (170) projected onto the hydrophobic surface (131) has a shape configured to contain the droplet (140) during movement of the droplet (140) on the hydrophobic surface (131). Specifically, the image (170) comprises a shape having a first leg (171), a second leg (172), and a third leg (173) connecting the first leg (171) and the second leg (172). Further, the first leg (171) and the second leg (172) are substantially parallel to one another and the third leg (173) is substantially perpendicular to the first leg (171) and the second leg (172). Thus, in the embodiment of FIGS. 7(a)-(d), the image (170) is substantially U-shaped.

Figure 8:
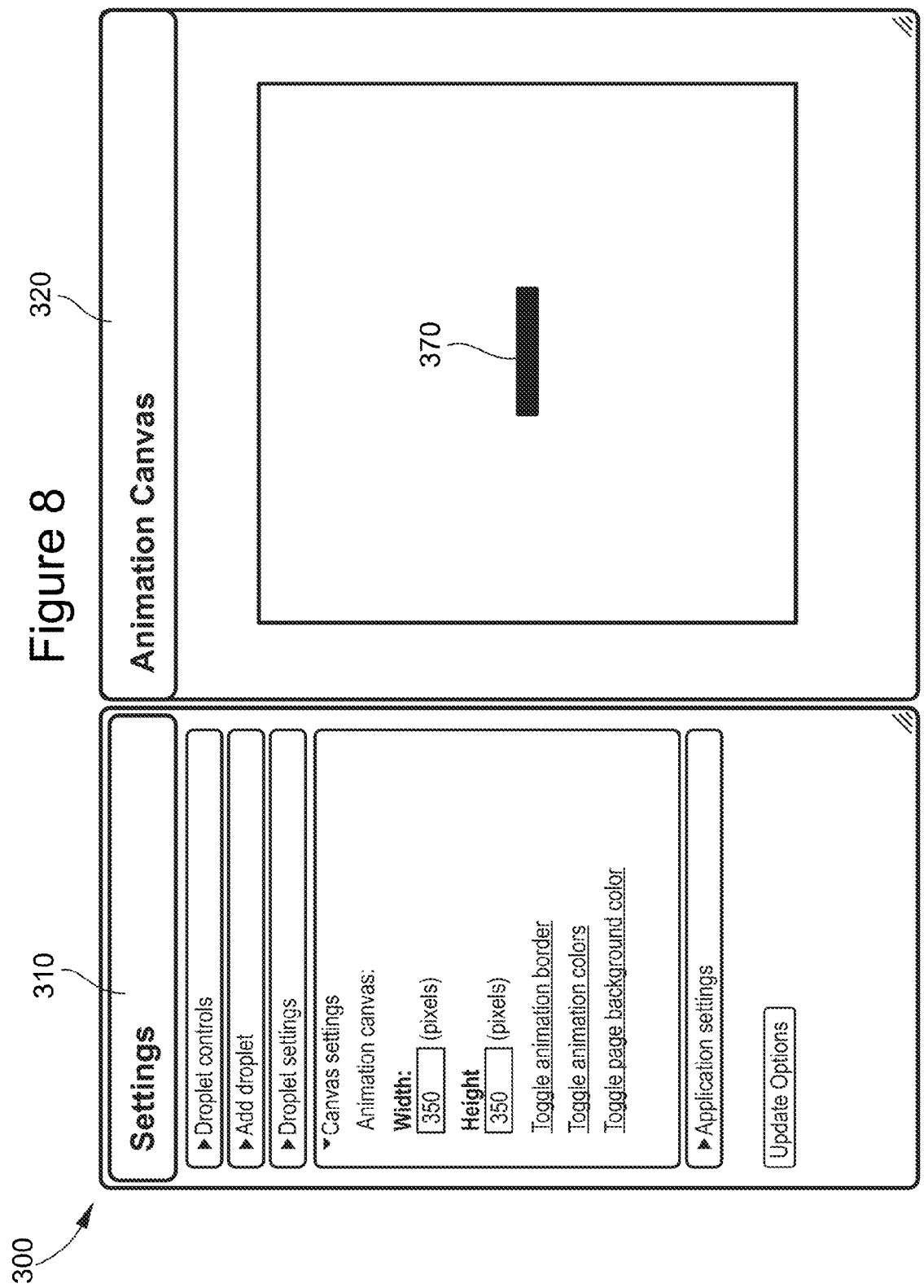
FIG. 8 illustrates a graphical user interface for moving a droplet of liquid according to one embodiment of a method described herein.

FIG. 8 illustrates a graphical user interface (300) for a JavaScript computer program that can be used to move an image described herein. Specifically, the interface (300) can be used to provide an optical pattern or pattern of light and dark areas that form an image (370). The image (370) can "move" or change position, shape, and/or orientation in a desired manner over time as the pattern changes.

As illustrated in FIG. 8, an optical pattern can be generated using a canvas-enabled JavaScript application. The canvas features of JavaScript can run in any modern Internet browsing user agent, with or without Internet connection. Further, a JavaScript application can be highly portable and quickly adaptable on a wide range of devices including desktops connected to a monitor or a projector, smart phones such as iPhones, or touchscreen tablet devices such as iPads.

In the embodiment of FIG. 8, the optical pattern is controlled using mouse clicks and keyboard commands in the JavaScript file. The interface (300) consists of two main components referred as the settings menu (310) and the animation canvas (320). The settings menu (310) controls the size, shape, speed, and color of the optical patterns and thus the image (370). All the values specified in the settings menu (310) in FIG. 8 are represented in pixels. The animation canvas (320) is the region where the optical pattern is displayed to form an image (370), based on the values in the settings menu (310). The image (370) can be moved anywhere on the animation canvas (320) using mouse clicks. Although FIG. 8 illustrates only one image (370), it is to be understood that the same principles apply to the use of more than one image, as described further herein.

III. Methods of Reducing the Drift of a Droplet of Liquid

In another aspect, methods of reducing the drift of a droplet of liquid are described herein. The drift of a droplet of liquid, for reference purposes herein, comprises movement of the droplet in a direction that is different from the desired motion of the droplet. For example, the drift of a droplet moved in a desired first direction can in some cases comprise movement in a second direction that is orthogonal or substantially orthogonal to the desired first direction. With reference to FIGS. 5(a)-(d), for instance, a droplet (140) moved to the right in a desired first direction indicated by arrow A can, during the course of such movement, also drift in a second direction indicated by arrow B. In the embodiment of FIG. 5, the drift occurs along a length of the projected image (170). Such drift can be undesirable in some cases when precise droplet movement in more than one dimension is required.

In some embodiments described herein, a method of reducing the drift of a droplet of liquid comprises disposing the droplet on a hydrophobic surface of a dielectric assembly of a single-sided microfluidic device described herein. Any microfluidic device described hereinabove in Section I may be used. The dielectric assembly of the device can be positioned over a photoconductive layer in electrical communication with electrical contacts, and the method can further comprise applying a voltage to the electrical contacts; projecting an image onto the photoconductive layer with a radiation source, and moving the droplet on the hydrophobic surface by moving the image, wherein the image partially overlaps the droplet and has a shape configured to contain the droplet during movement of the droplet on the hydrophobic surface. A shape configured to "contain" a droplet, for reference purposes herein, can prevent, reduce, or limit the drift of the droplet in an undesired direction, including by providing one or more boundaries for partially or completely enclosing the droplet, as described further hereinbelow.

Turning now to specific steps of methods, methods of reducing the drift of a droplet of liquid comprise applying a voltage to the electrical contacts of a microfluidic device described herein. A voltage can be applied to the electrical contacts in any manner not inconsistent with the objectives of the present invention, including in any manner described hereinabove in Section II. For example, in some cases, the electrical contacts comprise non-collinear electrical contacts and applying a voltage comprises applying a voltage to all of the non-collinear electrical contacts simultaneously. In other embodiments, voltage is applied to less than all of the non-collinear electrical contacts of the device.

Methods of reducing the drift of a droplet of liquid also comprise projecting an image onto a photoconductive layer of the microfluidic device with a radiation source. Any radiation source not inconsistent with the objectives of the present invention may be used. In some embodiments, a radiation source comprises a radiation source described hereinabove in Section I. For example, in some embodiments, a radiation source is a flat panel display such as a liquid crystal display (LCD) or optoelectronic screen.

In addition, projecting an image with a radiation source can be carried out in any manner not inconsistent with the objectives of the present invention, including in a manner described hereinabove in Section II. In some embodiments, for instance, a static or dynamic image is provided using a pre-defined illumination pattern or series of illumination patterns provided by the radiation source, such as a pattern or series of patterns providing using a computer application, algorithm, or software that provides a graphical output to a flat panel display such as an optoelectronic screen.

Further, in some embodiments, an image overlaps the droplet of liquid an amount substantially equal to the radius of the droplet. In addition, an image projected as described herein can have any size and shape not inconsistent with the objectives of the present invention. For example, in some instances, an image has a shape configured to contain the droplet of liquid during movement of the droplet on the hydrophobic surface. In some embodiments, an image comprises a polygon or a curved shape. In some instances, an image comprises a shape formed from both curved lines and straight line segments or from the intersection or union of a polygon and a curved shape. Moreover, in some cases, an image comprises a hollow or "frame" shape, such as a rectangular, elliptical, or circular "picture frame" or "donut" type shape. In some embodiments, an image comprises a shape having a first leg, a second leg, and a third leg connecting the first and second legs. Further, in some cases, the first and second legs are substantially parallel to one another and the third leg is substantially perpendicular to the first and second legs. In some embodiments, an image described herein has a U-shape, H-shape or V-shape. Moreover, in some instances, the image overlaps the droplet between two arms of the U-shape, H-shape or V-shape. Additionally, in some embodiments, the ratio of the radius of the droplet of liquid to a width of an image projected onto the photoconductive layer is between about 0.67 and about 2.0 or between about 0.85 and about 1.5. In some embodiments, the ratio of the radius of the droplet to a width of the image is between about 0.9 and about 1.3, between about 0.9 and about 1.2, or between about 0.95 and about 1.15.

Methods of reducing the drift of a droplet of liquid described herein also comprise moving the droplet on a hydrophobic surface by moving the image. The image can be moved in any manner not inconsistent with the objectives of the present invention, including in a manner described hereinabove in Section II. In some embodiments, for instance, the image is moved by projecting the image with the radiation source using a pre-defined illumination pattern or series of illumination patterns, wherein the illumination pattern changes over time.

Additional embodiments will now be further described with reference to the following non-limiting examples.

EXAMPLE 1

Single-sided Microfluidic Devices

Single-sided microfluidic devices according to some embodiments described herein were prepared as follows. For the fabrication of each device, a plain polished glass substrate (1 mm thick, 100 mm diameter manufactured by PG & O, Inc.) was first cleaned using Piranha solution (7:3, concentrated sulfuric acid:30% hydrogen peroxide) for 10 minutes to remove any organic residues. Next, a photoconductive layer formed from hydrogenated amorphous silicon (a-Si:H) was deposited onto the substrate using Plasma Enhanced Chemical Vapor Deposition (PECVD). Electrical contacts were then formed by depositing chromium (10 nm) and gold (100 nm) using electron beam deposition (LESKER PVD75). An aluminum foil was used as a pattern mask to protect the active region of the device from metal deposition. A thin, pin-hole free film of aluminum oxide ($Al_2O_3$) was then deposited onto the photoconductive layer using atomic layer deposition (ALD). Next, the coated substrate was spin coated with 2% Teflon (1:2, 6% TeflonAF:Flourinert FC40) using a spin coater (Laurell) operated at 3000 rpm for 60 seconds. The device was then baked at 160° C. for 10 minutes to provide a device having the structure illustrated in FIG. 1, except the thicknesses of the layers were as described herein rather than as illustrated in FIG. 1. Specifically, the thicknesses of the a-Si:H, $Al_2O_3$, and Teflon layers for two devices are shown in Table 1.

The thicknesses of the Teflon layers of the devices were computed using infrared spectroscopic ellipsometry. The effective capacitance values were determined using equation (1). For example, for Device 1, $\epsilon_0 = 8.854187817 \times 10^{-12}$ F/m, $\epsilon_{hy} = 1.93$, $\epsilon_{di} = 9.1$, $t_{hy} = 235$ nm, and $t_{di} = 25$ nm, so that $C_{effective} = 71.1129$ µF/m². Similarly, for Device 2, $\epsilon_0 = 8.854187817 \times 10^{-12}$ F/m, $\epsilon_{hy} = 1.93$, $\epsilon_{di} = 9.1$, $t_{hy} = 261$ nm, and $t_{di} = 10$ nm, so that $C_{effective} = 64.9457$ µF/m².

TABLE 1

| Device | a-Si:H (nm) | $Al_2O_3$ (nm) | Teflon (nm) | $C_{eff}$ (µF/m²) | $V_{th}$, Measured (V, DC) |
|---|---|---|---|---|---|
| 1 | 500 | 25 | 235 | 71.1129 | 53 |
| 2 | 500 | 10 | 261 | 64.9457 | 68.5 |

EXAMPLE 2

Methods of Moving a Droplet of Liquid

Methods of moving a droplet of liquid according to some embodiments described herein were carried out as follows. For each experiment described in this example, a single-sided microfluidic device of Example 1 was used. The device was immersed in a silicone oil medium inside a transparent petri dish, in a manner similar to that illustrated in FIG. 1. Droplets of liquid (10-70 µL) were then introduced onto the hydrophobic surface of the dielectric assembly of the device using a microliter syringe (Hamilton Company, Inc.).

Next, a pattern of images was projected onto the photoconductive layer of the device using either a commercial data projector (Dell 4210X) or an LCD screen (TFT LCD screen, Samsung Galaxy Tab 10.1 tablet) as the radiation source. When the data projector was used, the projector was controlled using a personal computer. Images (5 mm wide) and illumination patterns were generated using a canvas-enabled JavaScript application. The patterns were controlled using mouse clicks and keyboard commands in the JavaScript file, as described above with reference to FIG. 8. Specifically, the size, shape, position, speed, and color of the images or illumination patterns were specified in the settings menu. The images or illumination patterns were drawn on the animation canvas based on the values input in the settings menu. The images or patterns could be moved anywhere in the animation canvas using mouse clicks.

An external voltage was applied to a pair of diametrically opposed electrical contacts of the device using a Trek 2205 voltage amplifier powered by an EZ GP-4303D adjustable DC power supply. To record droplet movements, a Logitech C910 commercial web camera was placed directly above the device during operation. The measured threshold voltages for the devices are provided in Table 1 above.

When a data projector was used as the radiation source, Device 1 provided an average droplet movement speed of about 8 mm/s at an applied voltage of 53 V (DC), and Device 2 provided an average droplet movement speed of 3.5 mm/s at an applied voltage of 68.5 V (DC). In addition, with an applied voltage of 120 V (DC), Device 1 was able to provide a droplet speed of up to 12 mm/s. Not intending to be bound by theory, it is believed that the higher droplet speed provided by Device 1 compared to Device 2 was due to the higher effective capacitance of Device 1.

Various embodiments of the invention have been described in fulfillment of the various objects of the invention. It should be recognized that these embodiments are merely illustrative of the principles of the present invention. Numerous modifications and adaptations thereof will be readily apparent to those skilled in the art without departing from the spirit and scope of the invention.

That which is claimed is:

1. A single-sided microfluidic device comprising:
   a substrate;
   a photoconductive layer positioned over the substrate;
   electrical contacts in electrical communication with the photoconductive layer; and
   a dielectric assembly positioned over the photoconductive layer, the dielectric assembly comprising a hydrophobic surface for receiving a liquid and having an effective capacitance of about 10 $\mu F/m^2$ to about 10,000 $\mu F/m^2$;
   wherein at least a first layer of the dielectric assembly is formed from a hydrophobic dielectric material having a thickness between 50 nm and 300 nm, and at least a second layer of the dielectric assembly is formed from a dielectric material having a dielectric constant of at least about 3 and a thickness between 10 nm and 90 nm.

2. The single-sided microfluidic device of claim 1, wherein the substrate is radiation transmissive.

3. The single-sided microfluidic device of claim 1, wherein the first layer comprises a polymeric material and the second layer comprises a ceramic.

4. A single-sided microfluidic device comprising:
   a substrate;
   a photoconductive layer positioned over the substrate;
   non-collinear electrical contacts in electrical communication with the photoconductive layer; and
   a dielectric assembly positioned over the photoconductive layer, the dielectric assembly comprising a hydrophobic surface for receiving a liquid.

5. The single-sided microfluidic device of claim 4, wherein the electrical contacts are arranged in pairs diametrically opposed to one another.

6. The single-sided microfluidic device of claim 4, wherein the electrical contacts are positioned to permit liquid droplet movement in the lateral (x) and vertical (y) dimensions and combinations thereof.

7. A method of reducing the drift of a droplet of liquid comprising:
   disposing the droplet on a hydrophobic surface of a dielectric assembly of a single-sided microfluidic device, the dielectric assembly being positioned over a photoconductive layer that is in electrical communication with electrical contacts;
   applying a voltage to less than all of the electrical contacts simultaneously;
   projecting an image onto the photoconductive layer with a radiation source, the image partially overlapping the droplet; and
   moving the droplet on the hydrophobic surface by moving the image,
   wherein the image comprises an open shape having a plurality of boundaries that partially or completely enclose the droplet during movement of the droplet on the hydrophobic surface.

8. The method of claim 7, wherein the image comprises an open polygon, a crescent shape, a U-shape, an H-shape, or a V-shape.

* * * * *